(12) United States Patent
Finck (10) Patent No.: US 11,221,364 B1
(45) Date of Patent: Jan. 11, 2022

(54) DETECTION OF LEAKAGE OF A QUBIT WITHOUT DIRECTLY MEASURING THE QUBIT

(71) Applicant: INTERNATIONAL BUSINESS MACHINES CORPORATION, Armonk, NY (US)

(72) Inventor: Aaron Finck, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/006,346

(22) Filed: Aug. 28, 2020

(51) Int. Cl.
 *G01R 31/317* (2006.01)
 *G01R 31/3177* (2006.01)

(52) U.S. Cl.
 CPC ... *G01R 31/31703* (2013.01); *G01R 31/3177* (2013.01); *G01R 31/31706* (2013.01)

(58) Field of Classification Search
 None
 See application file for complete search history.

(56) References Cited

U.S. PATENT DOCUMENTS

| | | |
|---|---|---|
| 9,996,801 B2 | 6/2018 | Shim et al. |
| 10,217,057 B2 | 2/2019 | Barends |
| 10,572,816 B1 | 2/2020 | Vavilov et al. |
| 2018/0225586 A1 | 8/2018 | Chow et al. |
| 2019/0266508 A1 | 8/2019 | Bunyk et al. |
| 2019/0303788 A1 | 10/2019 | Kelly et al. |
| 2020/0050958 A1 | 2/2020 | Bloom et al. |

FOREIGN PATENT DOCUMENTS

WO  2017074379 A1  5/2017

OTHER PUBLICATIONS

Chen et al., "Measuring and Suppressing Quantum State Leakage in a Superconducting Qubit", Phys. Rev. Lett. 116, 020501—Published Jan. 13, 2016, arXiv:1509.05470v2 [quant-ph] Sep. 21, 2015.
Sheldon et al., "Procedure for systematically tuning up crosstalk in the cross resonance gate", Phys Rev A 93, J60302R (2016), rXiv:1603.04821v1 [quant-ph] Mar. 15, 2016.
Fowler "Coping with qubit leakage in topological codes", Phys Rev A 88, 042308 (2013), arXiv:1308.66 42v1 [quant-ph] Aug. 30, 2013.
Tripathi et al., "Operation and intrinsic error budget of a two-qubit cross-resonance gate", Phys Rev A 100, 012301 (2019), arXiv:1902.09054v2 [quant-ph] Jul. 12, 2019.
Aliferis et al., "Fault-Tolerant Quantum Computation for Local Leakage Faults", Quant. Inf. Comp. 7, 139 (2007).

*Primary Examiner* — Guerrier Merant
(74) *Attorney, Agent, or Firm* — Henry J. Daley; Venable LLP (57) ABSTRACT

A method of detecting leakage of a data qubit includes applying a first cross-resonance pulse to the data qubit, the data qubit including a first state and a second state; applying a first echo pulse to the data qubit temporally following the applied first cross-resonance pulse; applying a second cross-resonance pulse to the data qubit temporally following the applied first echo pulse, the second cross-resonance pulse being an inverted form of the first cross-resonance pulse; applying a second echo pulse to the data qubit temporally following the second cross-resonance pulse; and detecting a leakage associated with the data qubit using an ancilla qubit coupled to the data qubit based on application of the first and second cross-resonance pulses, and the first and second echo pulses.

20 Claims, 9 Drawing Sheets

DETECTION OF LEAKAGE OF A QUBIT WITHOUT DIRECTLY MEASURING THE QUBIT

BACKGROUND

The currently claimed embodiments of the present invention relate to quantum computation, and more specifically, to a quantum mechanical system for detecting leakage of a data qubit and a method of detecting leakage of a data qubit.

One building block in quantum computing is to be able to prepare qubits in specific quantum states. Qubits in a superconducting quantum computer are usually controlled using radiofrequency energy. The radiofrequency is delivered via a radiofrequency line to a resonator which in turn interacts with the qubits.

Qubits which can leak out of the $\{|0\rangle, |1\rangle\}$ computational basis, for example, can be detrimental for both quantum computation in general and quantum error correction specifically. Even a single leaked qubit can cause a logical error which can be reflected as an error in the overall quantum computation.

While measurement radiofrequency pulses can be calibrated to detect when ancilla qubits have leaked through direct measurement, this may not be possible for data qubits. Therefore, a need remains for a system and method for detecting the leakage of a data qubit without directly measuring the data qubit or otherwise projecting the data qubit into one state or another. In other words, it is desirable to detect the leakage of a data qubit while leaving the quantum state of the data qubit unchanged.

SUMMARY

An aspect of the present invention is to provide a method of detecting leakage of a data qubit. The method includes applying a first cross-resonance pulse to the data qubit, the data qubit including a first state and a second state; applying a first echo pulse to the data qubit temporally following the applied first cross-resonance pulse; applying a second cross-resonance pulse to the data qubit temporally following the applied first echo pulse, the second cross-resonance pulse being an inverted form of the first cross-resonance pulse; applying a second echo pulse to the data qubit temporally following the second cross-resonance pulse; and detecting a leakage associated with the data qubit using an ancilla qubit coupled to the data qubit based on application of the first and second cross-resonance pulses, and the first and second echo pulses.

In an embodiment, detecting the leakage associated with the data qubit includes detecting the leakage of the data qubit without directly measuring the data qubit or projecting the data qubit into the first state or into the second state so as to leave the data qubit as a superposition of the first state and the second state.

In an embodiment, applying the first cross-resonance pulse to the data qubit includes applying an adjusted amplitude of the first cross-resonance pulse to the data qubit so as to rotate the ancilla qubit around the X-axis or the Y-axis by $+\theta$ when the data qubit is the in first state and by $\theta-\pi$ when the data qubit is in the second state.

In an embodiment, the method further includes adjusting an amplitude of the applied first cross-resonance pulse, after applying the first cross-resonance pulse, the first echo pulse, and the second cross-resonance pulse, so as to rotate the ancilla qubit round the X-axis or the Y-axis by an angle $\theta$ equal to $+\pi$ or $-\pi$ when the data qubit is in the first state or when the data qubit is in the second state so that the ancilla qubit ends up in a same second state.

In an embodiment, applying the first echo pulse to the data qubit temporally following the applied first cross-resonance pulse includes applying the first echo pulse to the data qubit so as to rotate the data qubit around X-axis or Y-axis by $+\pi$ to obtain a changed state of the data qubit from the first state to the second state or to obtain a changed state of the data qubit from the second state to the first state.

In an embodiment, applying the second cross-resonance pulse to the data qubit temporally following the applied first echo pulse includes applying the selected amplitude of the second cross-resonance pulse to the data qubit so as to rotate the ancilla qubit around the X-axis or the Y-axis so the ancilla qubit is in the second state.

In an embodiment, applying the second echo pulse to the data qubit temporally following the applied second cross-resonance pulse includes applying the second echo pulse to the data qubit so as to rotate the data qubit around X-axis or Y-axis by $+\pi$ to obtain a changed state of the data qubit from the second state to the first state or to obtain a changed state of the data qubit from the first state to the second state. In an embodiment, the changed state of the data qubit from the second state to the first state while the ancilla qubit is in the second state. In an embodiment, the changed state of the data qubit from the first state to the second state while the ancilla qubit is in the second state.

In an embodiment, detecting the leakage associated with the data qubit using the ancilla qubit coupled to the data qubit includes measuring a state of the ancilla qubit and when the ancilla qubit is the second state determining that a leakage does not exist and when the ancilla qubit is in the first state determining that a leakage exists.

In an embodiment, applying the first echo pulse and applying the second echo pulse to the data qubit cause a rotation of the data qubit when the data qubit has not leaked and does not cause a rotation of the data qubit when the data qubit has leaked. In an embodiment, when the data qubit is a leaked data qubit, the leaked data qubit causes the first cross-resonance pulse to be cancelled out by the second cross-resonance pulse and the data qubit remains where it started in the first state.

Another aspect of the present invention is to provide a quantum mechanical system for detecting leakage of a data qubit. The system includes a data qubit and an ancilla qubit; a first cross-resonance gate configured to apply a first cross-resonance pulse to the data qubit to couple the data qubit to an ancilla qubit, the data qubit including a first state and a second state; a first pulse generator configured to apply a first echo pulse to the data qubit temporally following the applied first cross-resonance pulse; a second cross-resonance gate configured to apply a second cross-resonance pulse to the data qubit temporally following the applied first echo pulse to couple the data qubit with the ancilla qubit, the second cross-resonance pulse being an inverted form of the first cross-resonance pulse; a second pulse generator configured to apply a second echo pulse to the data qubit temporally following the second cross-resonance pulse; and a quantum mechanical detector configured to detect a leakage associated with the data qubit using the ancilla qubit coupled to the data qubit based on application of the first and second cross-resonance pulses, and the first and second echo pulses.

In an embodiment, the quantum mechanical detector is configured to detect the leakage of the data qubit without directly measuring the data qubit or projecting the data qubit into the first state or into the second state so as to leave the data qubit as the superposition of the first state and the second state.

In an embodiment, the first pulse generator is configured to applying the first echo pulse to the data qubit so as to rotate the data qubit around the X-axis or the Y-axis by $+\pi$ to obtain a changed state of the data qubit from the first state to the second state or to obtain a changed state of the data qubit from the second state to the first state.

In an embodiment, the second cross-resonance gate is configured to apply a selected amplitude of the second cross-resonance pulse to the data qubit so as to rotate the ancilla qubit around the X-axis or the Y-axis so the ancilla qubit is in the second state.

In an embodiment, the second pulse generator is configured to apply the second echo pulse to the data qubit so as to rotate the data qubit around X-axis or Y-axis by $+\pi$ to obtain a changed state of the data qubit from the second state to the first state or to obtain a changed state of the data qubit from the first state to the second state.

In an embodiment, the quantum mechanical detector is configured to measure a state of the ancilla qubit and determine that a leakage does not exist when the ancilla qubit is in the second state and determine that leakage exists when the ancilla qubit is in the first state.

In an embodiment, the data qubit and the ancilla qubit are transmon qubits. In an embodiment, the first pulse generator and the second pulse generator are a same and one pulse generator.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

In the following paragraphs, various technical terms are used herein throughout. These terms, although generally understood by those of ordinary skill in the art of quantum computing, are defined herein for further clarity.

Leakage is the typically accidental escape of a qubit from, for example, the $\{|0>, |1>\}$ computational basis, for example. In general, leakage is the accidental escape from a combination of a first state and a second state to a third state. The leakage may be, for example, due to noise in a quantum computational system, such as noise originating from temperature fluctuations, local defects and fabrication variation, etc.

A Cross Resonance (CR) gate is a two-qubit gate that is implemented by driving a control qubit with a radiofrequency pulse whose frequency is equal to a transition from one state to another state (qubit frequency) of a target qubit that is coupled to the control qubit. The target qubit can undergo Rabi oscillations as the radiofrequency drive pulse is transmitted "through" the control qubit. Semi-classically, a two-qubit entangling gate, such as a CNOT gate, is realized because the amplitude of the transmitted drive depends on the state of the control qubit.

An echo pulse is a radiofrequency pulse applied to a qubit at its transition frequency that rotates its state vector by 180 degrees (i.e., $\pi$ radians) about the X-axis or Y-axis of the Bloch sphere. An echo pulse is frequently applied multiple times to help cancel out low frequency noise during extended pulse sequences (e.g., Carr-Purcell-Meiboom-Gill method for measuring dephasing times of a qubit).

A data qubit is a qubit that helps encode a logical qubit, in a quantum error correction code. A data qubit can be a combination of at least a first state and a second state. Therefore, as it can be appreciated, the data qubit can be a combination of two states, three states, or more.

An ancilla qubit is a qubit that is directly measured and used to detect errors in data qubits, in a quantum error correction code. The ancilla qubit can be coupled to the data qubit using a cross resonance (CR) gate, for example.

Figure 1:
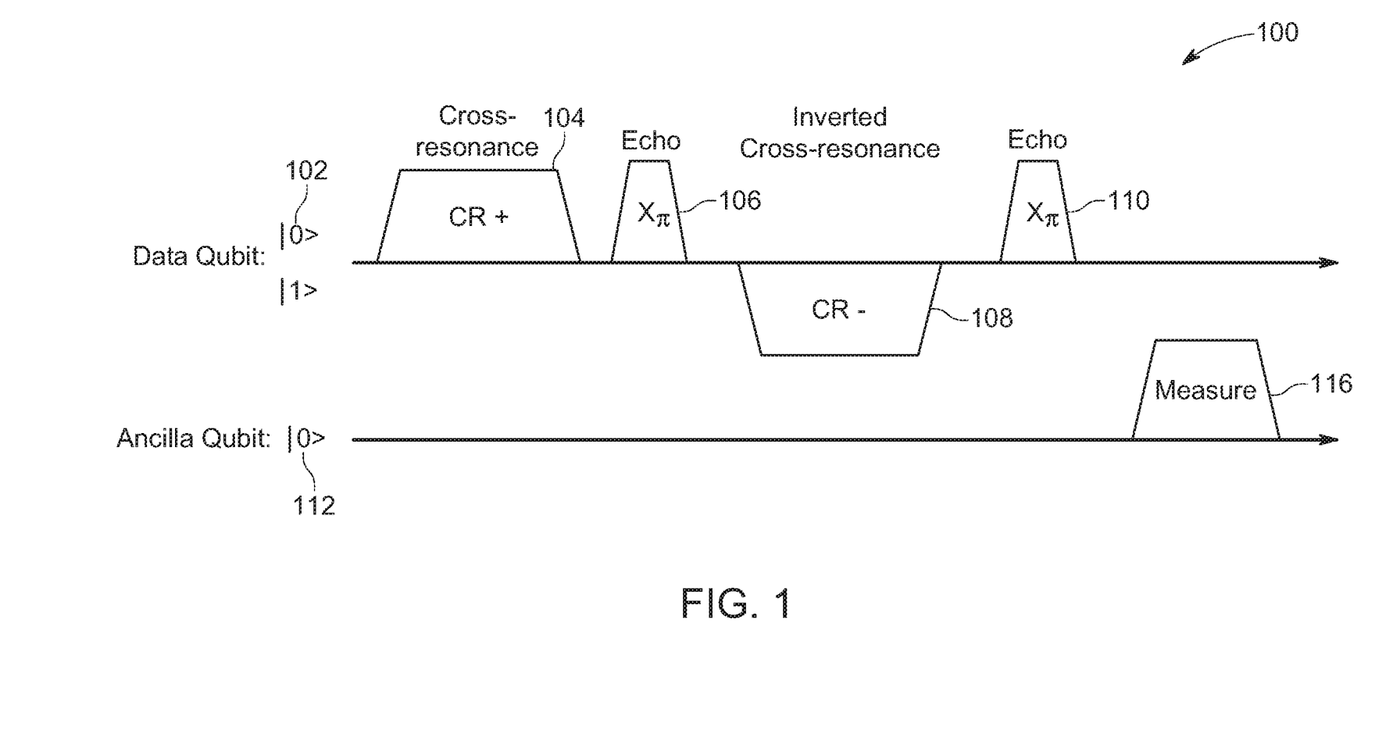
FIG. 1 is schematic diagram of a sequence of a method of detecting leakage of a data qubit, according to an embodiment of the present invention.

FIG. 1 is schematic diagram of a sequence 100 of a method of detecting leakage of a data qubit 102, according to an embodiment of the present invention. The method includes applying a first cross-resonance pulse (CR+) 104 to the data qubit 102. The data qubit 102 includes a first state and a second state. For example, the first state can be the ground state $|0>$ and the second state can be the excited state $|1>$. However, as it can be appreciated, the data qubit 102 can include two, three, or more quantum states. In addition, the two states can be states other than the ground state $|0>$ and the excited state $|1>$. For example, the first and second states can be excited states $|2>$ and $|3>$.

The method further includes applying a first echo pulse ($X\pi$) 106 to the data qubit 102 temporally following the applied first cross-resonance pulse (CR+) 104. The method also includes applying a second cross-resonance pulse (CR−) 108 to the data qubit 102 temporally following the applied first echo pulse ($X\pi$) 106. The second cross-resonance pulse (CR−) 108 is an inverted form of the first cross-resonance pulse (CR+) 104.

The method further includes applying a second echo pulse ($X\pi$) 110 to the data qubit temporally following the second cross-resonance pulse (CR−) 108. The method further includes detecting a leakage associated with the data qubit 102 using an ancilla qubit 112 coupled to the data qubit 102 based on application of the first cross-resonance pulse (CR+) 104 and the second cross-resonance pulse (CR−) 108, and the first echo pulse (Xπ) 106 and the second echo pulse (Xπ) 110.

In an embodiment, the detecting the leakage associated with the data qubit 102 includes detecting the leakage of the data qubit 102 without directly measuring the data qubit 102 or projecting the data qubit 102 into the first state (for example, the state |0>) or into the second state (for example, the state |1>) so as to leave the data qubit 102 as a superposition or combination of the first state and the second state.

Figure 2:
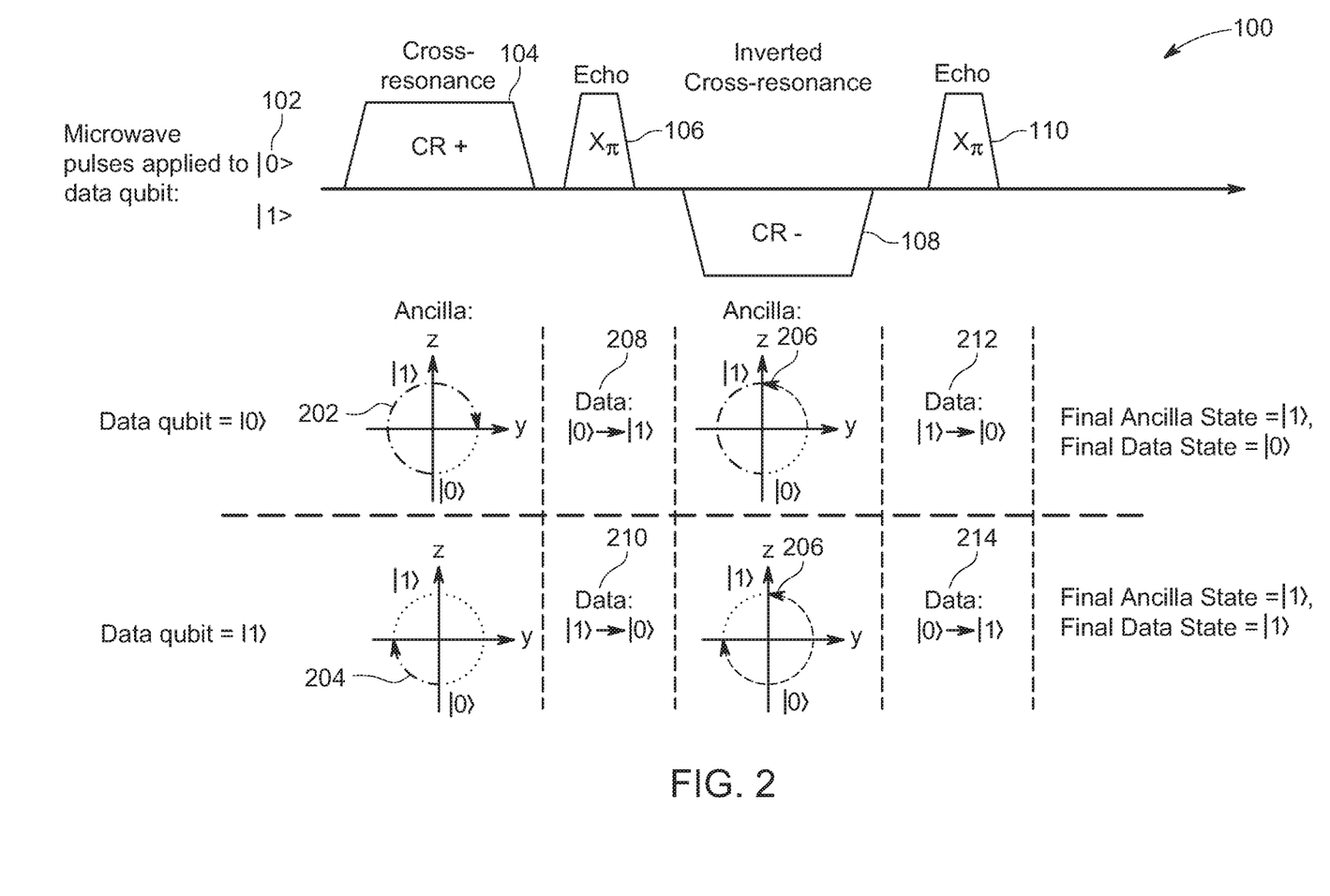
FIG. 2 is schematic diagram of the sequence of the method of detecting leakage of the data qubit with corresponding state of the data qubit and ancilla qubit on the Bloch sphere, at each step with the application of each pulse, according to an embodiment of the present invention.

FIG. 2 is schematic diagram of the sequence 100 of the method of detecting leakage of the data qubit 102 with corresponding state of the data qubit 102 and ancilla qubit 112 on the Bloch sphere, at each step with the application of each pulse, according to an embodiment of the present invention. FIG. 2 depicts the evolution of ancilla qubit 112 when the data qubit 102 has not leaked.

In an embodiment, the applying of the first cross-resonance pulse (CR+) 104 to the data qubit 102 includes applying an adjusted amplitude of the first cross-resonance pulse (CR+) 104 to the data qubit 102 so as to rotate the ancilla qubit 112 (which is for example in the state |0>) around the X-axis or the Y-axis by θ, as shown at 202, when the data qubit 102 is the in first state (e.g., the state |0>) and by θ-π, as shown at 204, when the data qubit 102 is in the second state (e.g., the state |1>). FIG. 2 shows a rotation of the of the ancilla qubit 112 around the X-axis, as the rotation is shown in the YZ-coordinates. However, the same can be applied for a rotation around the Y-axis.

In an embodiment, the method also includes adjusting an amplitude of the applied first cross-resonance pulse (CR+) 104, after applying the first cross-resonance pulse (CR+) 104, the first echo pulse (Xπ) 106, and the second cross-resonance pulse (CR−) 108, so as to rotate the ancilla qubit 112 around the X-axis or the Y-axis by an angle θ equal to +π or −π when the data qubit 102 is in the first state (e.g., the state |0>) or when the data qubit 102 is in the second state (e.g., the state |1>) so that the ancilla qubit 112 ends up in a same second state (e.g., the state |1>), as shown at 206.

In an embodiment, applying the first echo pulse (Xπ) 106 to the data qubit 102 temporally following the applied first cross-resonance pulse (CR+) 104 includes applying the first echo pulse (Xπ) 106 to the data qubit 102 so as to rotate the data qubit 102 around X-axis or Y-axis by +π to obtain a changed state of the data qubit 102 from the first state (e.g., the state |0>) to the second state (e.g., the state |1>), as shown at 208, or to obtain a changed state of the data qubit 102 from the second state (e.g., the state |1>) to the first state (e.g., the state |0>), as shown at 210.

In an embodiment, the applying the second cross-resonance pulse (CR−) 108 to the data qubit 102 temporally following the applied first echo pulse (Xπ) 106 includes applying the selected amplitude of the second cross-resonance pulse (CR−) 108 to the data qubit 102 so as to rotate the ancilla qubit 112 around the X-axis or the Y-axis so the ancilla qubit 112 is in the second state (e.g., the state |1>), as shown at 206. For example, if the ancilla qubit 112 is initially in the state |0>, the ancilla qubit 112 ends up in the state |1>, as shown at 206.

In an embodiment, applying the second echo pulse (Xπ) 110 to the data qubit 102 temporally following the applied second cross-resonance pulse (CR−) 108 includes applying the second echo pulse (Xπ) 110 to the data qubit 102 so as to rotate the data qubit 102 around X-axis or Y-axis by +π to obtain a changed state of the data qubit 102 from the second state (e.g., the state |1>) to the first state (e.g., the state |0>), as shown at 212, or to obtain a changed state of the data qubit 102 from the first state (e.g., the state |0>) to the second state (e.g., the state |1>), as shown at 214.

In an embodiment, the changed state of the data qubit 102 from the second state (e.g., the state |1>) to the first state (e.g., the state |0>), as shown at 212, is accomplished while the ancilla qubit 112 is in the second state (e.g., the state |1>), as shown at 206.

In an embodiment, the changed state of the data qubit 102 from the first state (e.g., the state |0>) to the second state (e.g., the state |1>), as shown at 214, is accomplished while the ancilla qubit 112 is in the second state (e.g., the state |1>), as shown at 206.

In an embodiment, referring to FIG. 1, detecting the leakage associated with the data qubit using the ancilla qubit 112, coupled to the data qubit 102 via the cross-resonance pulses (CR+) and (CR−) 104, 108, includes measuring a state of the ancilla qubit 112, as shown at 116 in FIG. 1. When the ancilla qubit 112 is the second state (e.g., the state |1>) determining that a leakage does not exist and when the ancilla qubit is in the first state (e.g., the state |0>) determining that a leakage exists.

Figure 3:
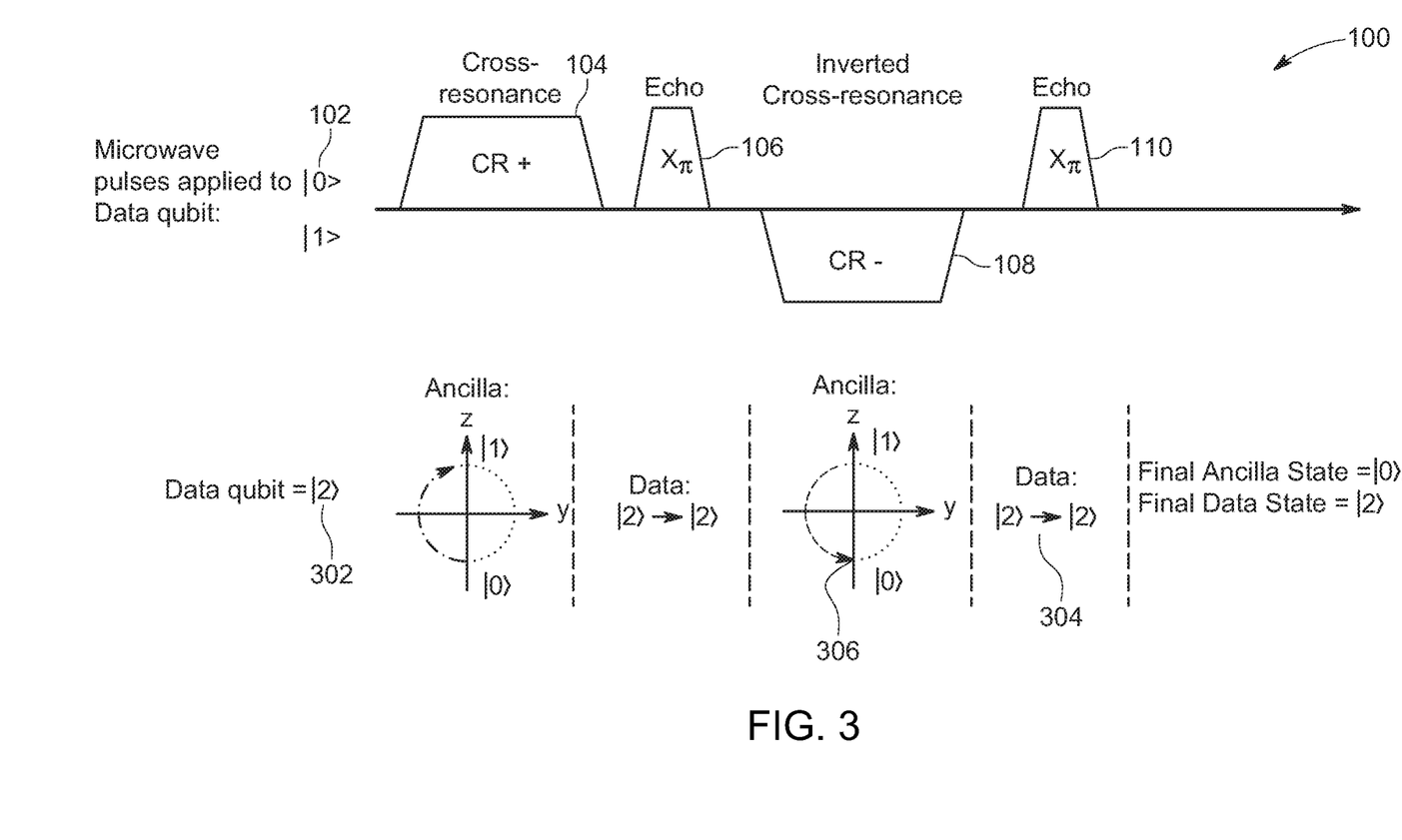
FIG. 3 is schematic diagram of the sequence of the method of detecting leakage of a data qubit with corresponding state of the data qubit and ancilla qubit in the Bloch sphere, at each step with the application of each pulse, according to another embodiment of the present invention.

FIG. 3 is schematic diagram of the sequence 100 of the method of detecting leakage of a data qubit 102 with corresponding state of the data qubit 102 and ancilla qubit 112 in the Bloch sphere, at each step with the application of each pulse, according to another embodiment of the present invention. FIG. 3 depicts the evolution of ancilla qubit 112 when the data qubit 102 has leaked.

In an embodiment, applying the first echo pulse (Xπ) 106 and applying the second echo pulse (Xπ) 110 to the data qubit 102 cause a rotation of the data qubit 102, when the data qubit 102 has not leaked, as shown in FIG. 2, and does not cause a rotation of the data qubit 102 when the data qubit has leaked, as shown in FIG. 3.

In an embodiment, as shown in FIG. 3, when the data qubit 102 is a leaked data qubit, the leaked data qubit (in state |2>, for example) 302 causes the first cross-resonance pulse (CR+) 104 to be cancelled out by the second cross-resonance pulse (CR−) 108 and the data qubit 102 remains where it started in the first state (state |2> in this case), as shown at 304 in FIG. 3.

Therefore, as it can be understood from the above paragraphs, if the data qubit 102 is in either the state |0⟩ or the state |1⟩, for example, the echoed cross-resonance will rotate the ancilla qubit 112 around X-axis or Y-axis by equal but opposite angles. Echo pulses (Xπ) 106 and 110 will essentially have no effect on the data qubit 102 if the data qubit 102 is not in the {|0⟩, |1⟩} computational basis, for example, so inverted cross-resonance pulse (CR−) 108 will cancel the first cross-resonance pulse (CR+) 104 and return the ancilla qubit 112 to the initial first state |0⟩, for example, as shown at 306 in FIG. 3.

The cross-resonance pulse amplitudes can be calibrated or adjusted so that the ancilla qubit 112 rotates by +π if data qubit is in |0⟩ state and −π if data qubit is in |1⟩ state, as shown in FIG. 2. If the data qubit 102 is in the {|0⟩, |1⟩} computational basis, for example, the ancilla qubit 112 is rotated to the state |1⟩, for example, as shown at 206 in FIG. 2. If the data qubit 102 has leaked, the ancilla qubit 112 will end in the $|0\rangle$ state, as shown at 306 in FIG. 3.

Figure 4:
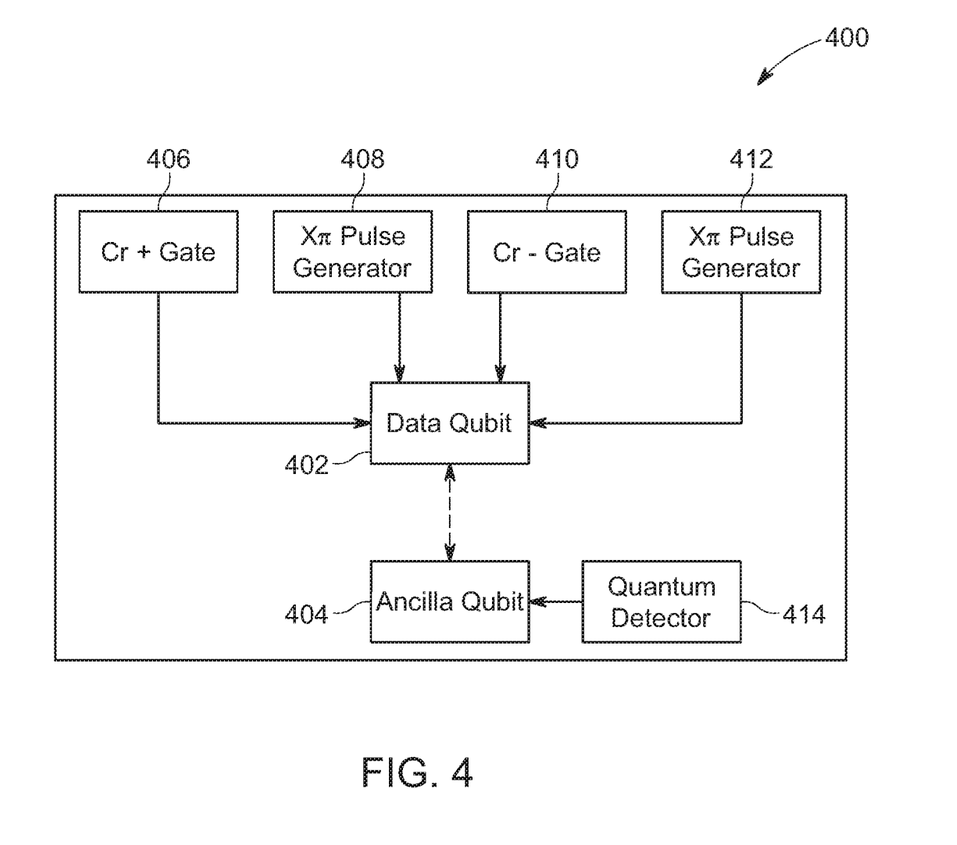
FIG. 4 is a schematic diagram of a quantum mechanical system for detecting leakage of a data qubit, according to an embodiment of the present invention.

FIG. 4 is a schematic diagram of a quantum mechanical system 400 for detecting leakage of a data qubit 402, according to an embodiment of the present invention. The quantum mechanical system 400 includes the data qubit 402 and an ancilla qubit 404. The system 400 also includes a first cross-resonance gate 406 configured to apply a first cross-resonance pulse to the data qubit 402 to couple the data qubit 402 to the ancilla qubit 404, the data qubit 402 including a first state and a second state. The system 400 further includes a first pulse generator 408 configured to apply a first echo pulse to the data qubit 402 temporally following the applied first cross-resonance pulse. The system 400 also includes a second cross-resonance gate 410 configured to apply a second cross-resonance pulse to the data qubit 402 temporally following the applied first echo pulse to couple the data qubit 402 with the ancilla qubit 404, the second cross-resonance pulse being an inverted form of the first cross-resonance pulse. The system 400 further includes a second pulse generator 412 configured to apply a second echo pulse to the data qubit 402 temporally following the second cross-resonance pulse. The system 400 also includes a quantum mechanical detector 414 configured to detect a leakage associated with the data qubit 402 using the ancilla qubit 404 coupled to the data qubit 402 based on application of the first and second cross-resonance pulses, and the first and second echo pulses. In an embodiment, the data qubit 402 and the ancilla qubit 404 can be superconducting transmon qubits.

In an embodiment, the quantum mechanical detector 414 is configured to detect the leakage of the data qubit 402 without directly measuring the data qubit 402 or projecting the data qubit 402 into the first state or into the second state so as to leave the data qubit 402 as the superposition of the first state and the second state.

In an embodiment, the first pulse generator 408 is configured to applying the first echo pulse to the data qubit 402 so as to rotate the data qubit around the X-axis or the Y-axis by $+\pi$ to obtain a changed state of the data qubit 402 from the first state to the second state or to obtain a changed state of the data qubit from the second state to the first state.

In an embodiment, the second cross-resonance gate 410 is configured to apply a selected amplitude of the second cross-resonance pulse to the data qubit 402 so as to rotate the ancilla qubit 404 around the X-axis or the Y-axis so the ancilla qubit is in the second state.

In an embodiment, the second pulse generator 412 is configured to apply the second echo pulse to the data qubit 402 so as to rotate the data qubit 402 around X-axis or Y-axis by $+\pi$ to obtain a changed state of the data qubit 402 from the second state to the first state or to obtain a changed state of the data qubit from the first state to the second state.

In an embodiment, the quantum mechanical detector 414 is configured to measure a state of the ancilla qubit 404 and determine that a leakage does not exist when the ancilla qubit 404 is in the second state and determine that leakage exists when the ancilla qubit is in the first state. In an embodiment, the first pulse generator 408 and the second pulse generator 412 are one and a same pulse generator.

Figure 5:
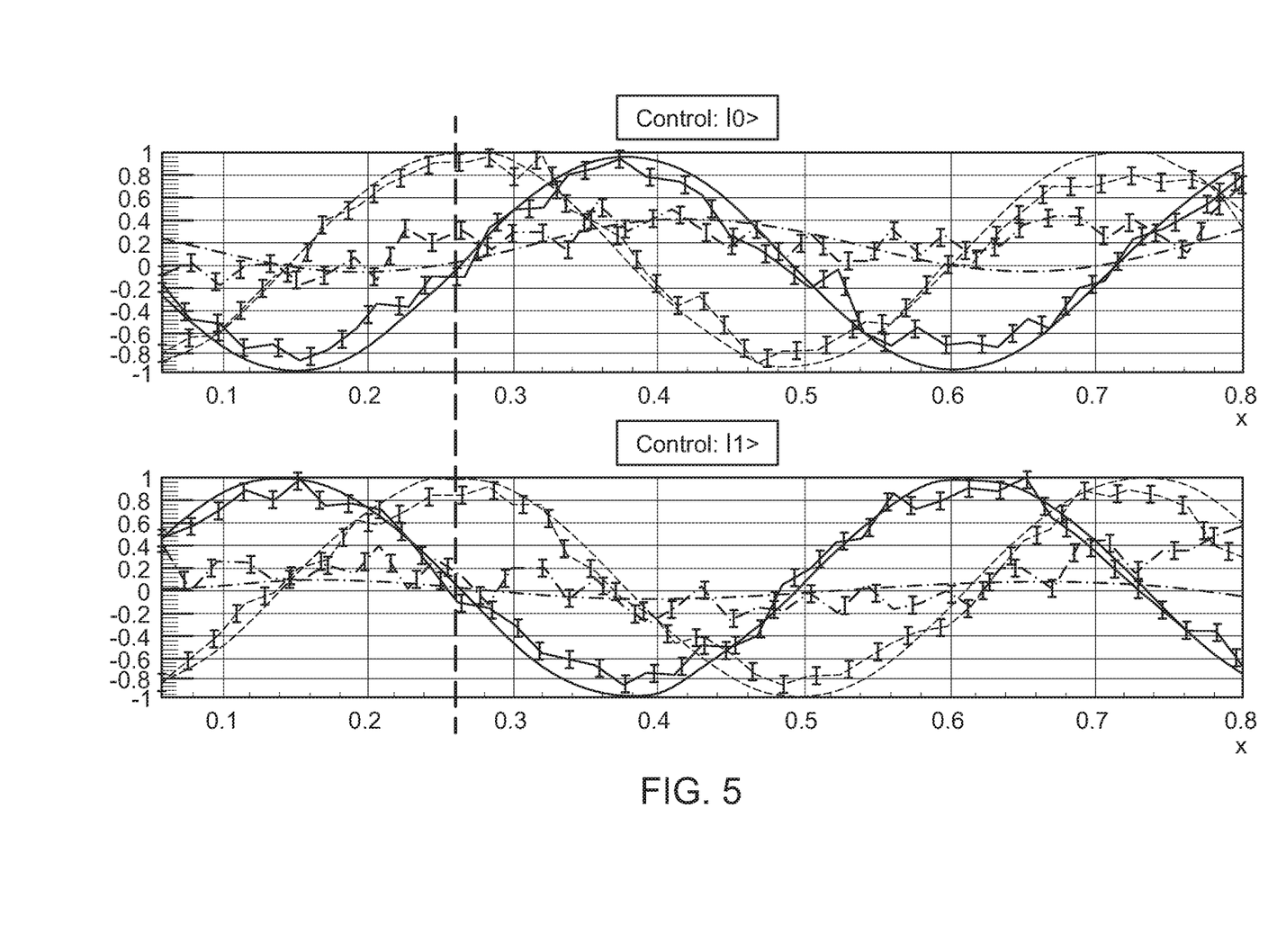
FIGS. 5 and 6 are plots of results of an example experimental demonstration of the above described methods when applied on a five-qubit section of a device (e.g., having qubits Q8, Q9, Q10, Q11, and Q12), according to embodiments of the present invention.
Figure 6:
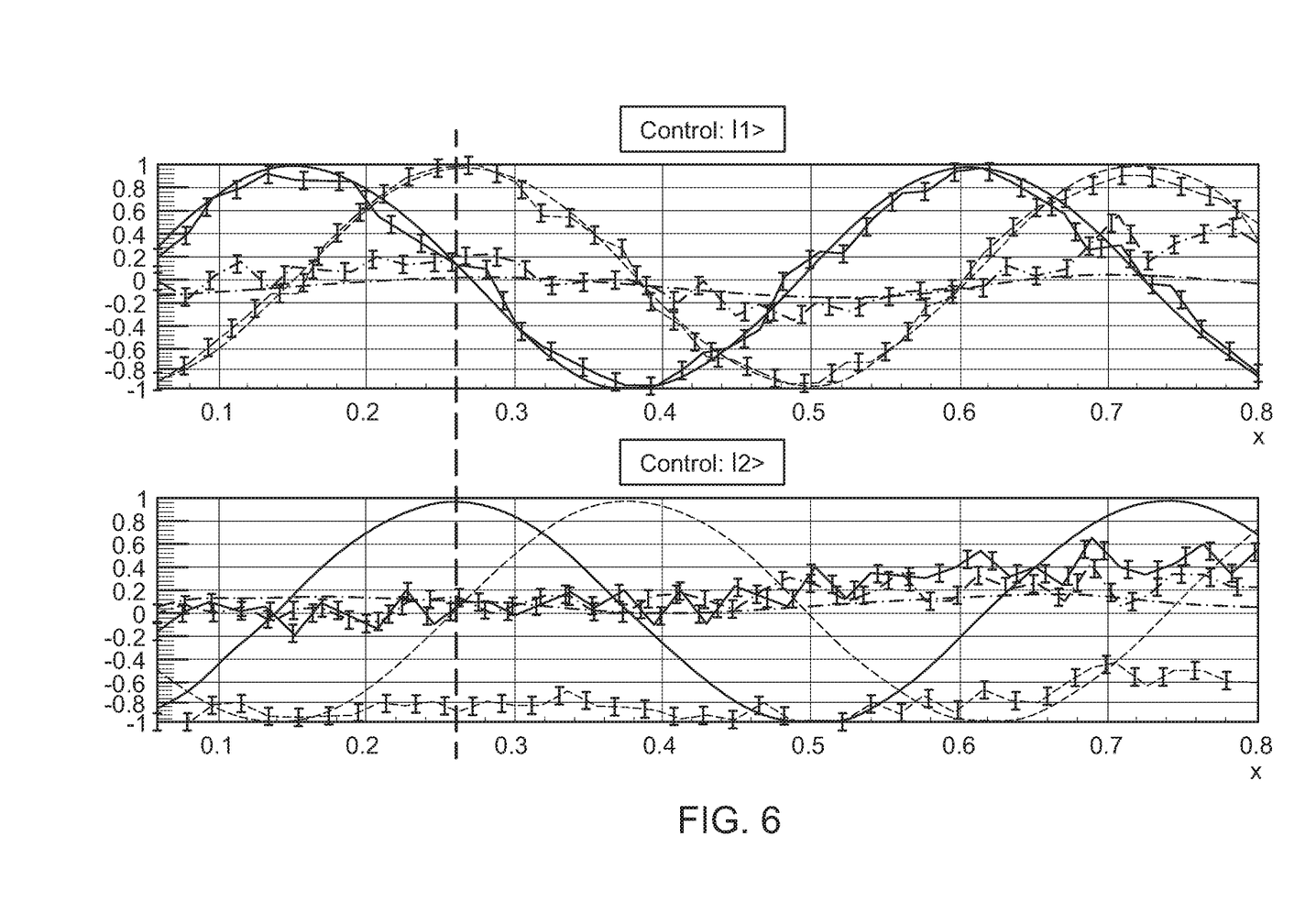

FIGS. 5 and 6 are plots of results of an example experimental demonstration of the above described methods when applied on a five-qubit section of a device (e.g., having qubits Q8, Q9, Q10, Q11, and Q12), according to embodiments of the present invention. In this example, only three CR gates are properly tuned up (8→9, 10→9, and 11→10). We focus on Q10 (frequency=5.12 GHz) and Q11 (frequency=5.25 GHz). The lifetime of a qubit state is T1~T2~100 microseconds. T1 of state |2> is about 50 microseconds. Similar results were found for other two sets of CR gates.

FIG. 5 shows the Hamiltonian tomography of CR gate qubit Q11→qubit Q10: control qubit (Q11) in |0> or |1> state, with a measure of target qubit Q10. The horizontal axis corresponds to time and the vertical axis corresponds to a bin number normalized. In this configuration, the target qubit Q10 ends up in state $|1\rangle$, independent of the control qubit Q11. The plots on the top labeled control |0> correspond to the control qubit Q11 in the state |0>. The plots on the bottom labeled control |1> correspond to the control qubit Q11 in the state |1>. The measured data are connected symbols by segments and the solid lines are corresponding fitted curves. The vertical dotted line corresponds to a time when the target qubit ends up in state $|1\rangle$, independent of the control qubit.

FIG. 6 shows the Hamiltonian tomography of CR gate qubit Q11→qubit Q10: control qubit (Q11) in |1> or |2> state, with a measure of target qubit Q10. The horizontal axis corresponds to time and the vertical axis corresponds to a bin count normalized. The plots on the top labeled control |1> correspond to the control qubit Q11 in the state |1>. The plots on the bottom labeled control |2> correspond to the control qubit Q11 in the state |2>. The measured data are connected symbols by segments and the solid lines are corresponding fitted curves. The vertical dotted line corresponds to a time when a target qubit ends up in state $|1\rangle$ if control is in state $|1\rangle$, but target qubit stays in state $|0\rangle$ state if control is in state $|2\rangle$.

Figure 7:
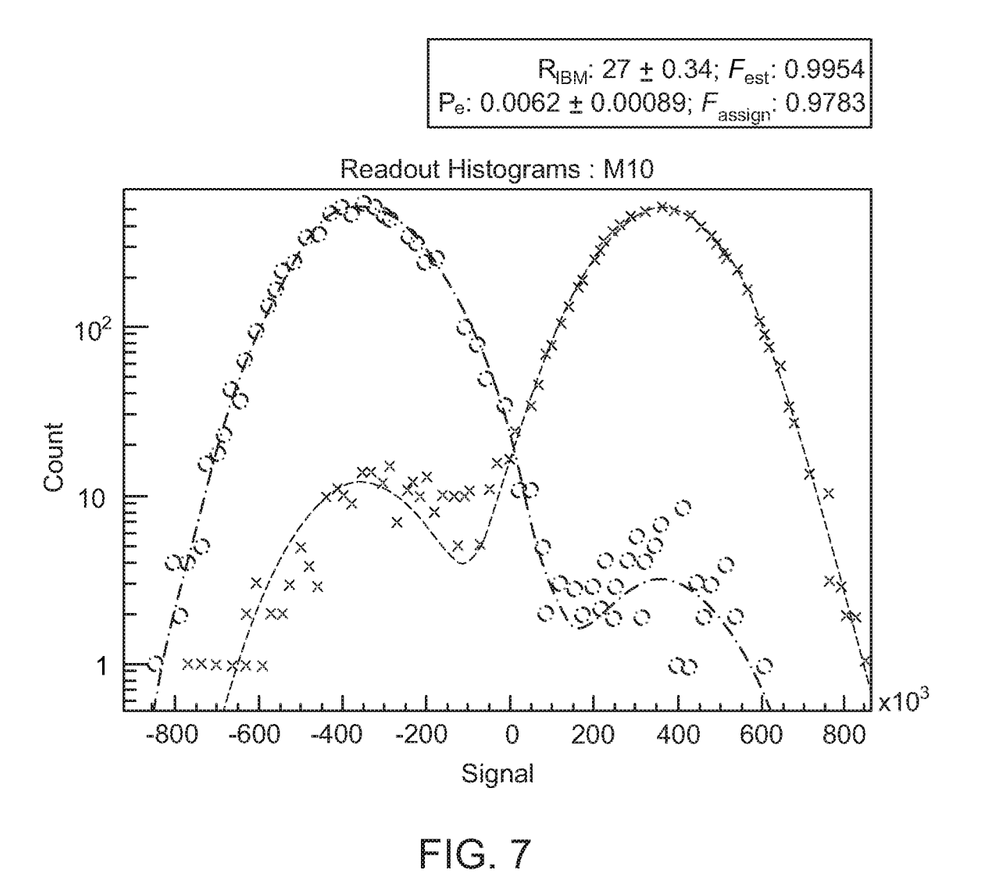
FIGS. 7, 8 and 9 are readout histograms for testing leakage detection of qubit Q11 to qubit Q10, according to an embodiment of the present invention.
Figure 8:
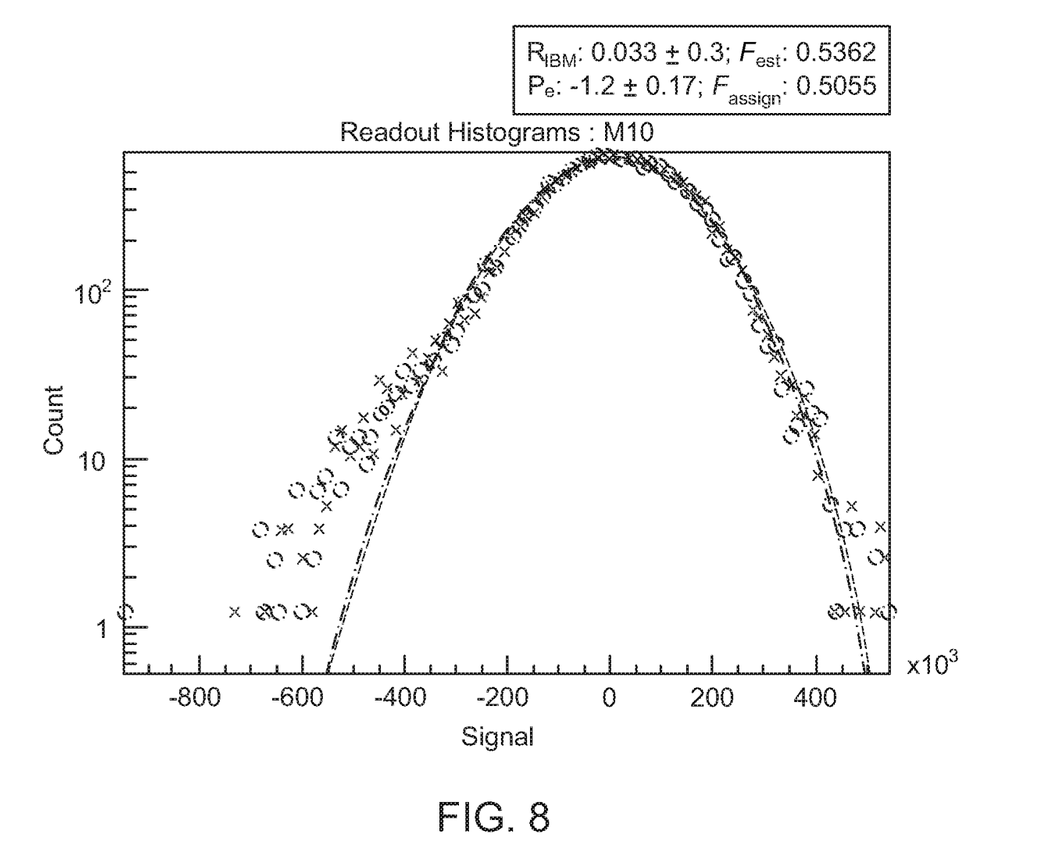
Figure 9:
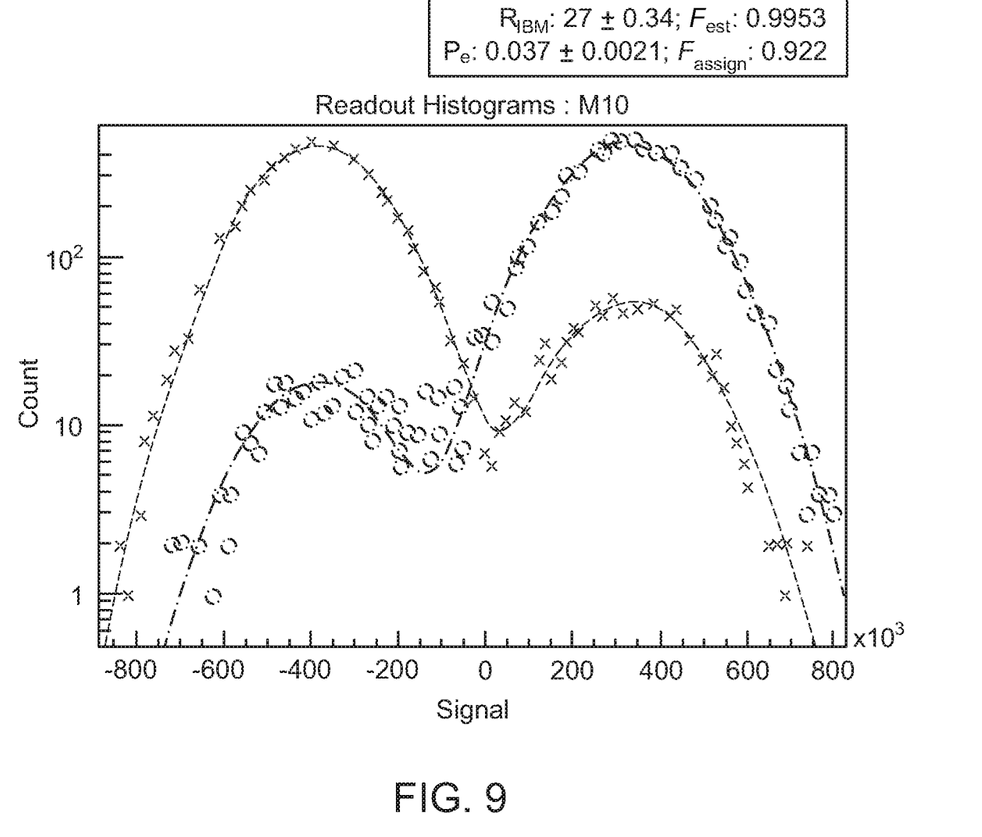

FIGS. 7, 8 and 9 are readout histograms for testing leakage detection of qubit Q11 to qubit Q10, according to an embodiment of the present invention. The horizontal axis corresponds to the signal (linear) and the vertical axis correspond to the bin count (logarithmic). FIG. 7 shows a conventional readout test of qubit Q10. Qubit Q10 is initialized to either |0> or |1> and then qubit Q10 is measured. FIG. 8 shows a leakage detection test of qubit Q11 to qubit Q10. Qubit Q11 is initialized to either |0> or |1>, followed by an echoed cross-resonance CR, and then qubit Q10 is measured. It is noted that qubit Q10 ends up in same state, independent of the state of qubit Q11. FIG. 9 shows a readout test of leakage detection of qubit Q11 to qubit Q10. The qubit Q11 is initialized to either |1> or |2>, followed by an echoed cross-resonance CR, them qubit Q10 is measured. In this case, qubit Q10 ends up in state $|0\rangle$ if qubit Q11 started in state $|2\rangle$.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

I claim:

1. A method of detecting leakage of a data qubit, comprising:
   applying a first cross-resonance pulse to the data qubit, the data qubit including a first state and a second state;
   applying a first echo pulse to the data qubit temporally following the applied first cross-resonance pulse;
   applying a second cross-resonance pulse to the data qubit temporally following the applied first echo pulse, the second cross-resonance pulse being an inverted form of the first cross-resonance pulse;
   applying a second echo pulse to the data qubit temporally following the second cross-resonance pulse; and
   detecting a leakage associated with the data qubit using an ancilla qubit coupled to the data qubit based on application of the first and second cross-resonance pulses, and the first and second echo pulses.

2. The method according to claim 1, wherein detecting the leakage associated with the data qubit comprises detecting the leakage of the data qubit without directly measuring the data qubit or projecting the data qubit into the first state or into the second state so as to leave the data qubit as a superposition of the first state and the second state.

3. The method according to claim 1, wherein applying the first cross-resonance pulse to the data qubit comprises applying an adjusted amplitude of the first cross-resonance pulse to the data qubit so as to rotate the ancilla qubit around the X-axis or the Y-axis by $+\theta$ when the data qubit is the in first state and by $\theta-\pi$ when the data qubit is in the second state.

4. The method according to claim 3, further comprising adjusting an amplitude of the applied first cross-resonance pulse, after applying the first cross-resonance pulse, the first echo pulse, and the second cross-resonance pulse, so as to rotate the ancilla qubit round the X-axis or the Y-axis by an angle $\theta$ equal to $+\pi$ or $-\pi$ when the data qubit is in the first state or when the data qubit is in the second state so that the ancilla qubit ends up in a same second state.

5. The method according to claim 1, wherein applying the first echo pulse to the data qubit temporally following the applied first cross-resonance pulse comprises applying the first echo pulse to the data qubit so as to rotate the data qubit around X-axis or Y-axis by $+\pi$ to obtain a changed state of the data qubit from the first state to the second state or to obtain a changed state of the data qubit from the second state to the first state.

6. The method according to claim 1, wherein applying the second cross-resonance pulse to the data qubit temporally following the applied first echo pulse comprises applying the selected amplitude of the second cross-resonance pulse to the data qubit so as to rotate the ancilla qubit around the X-axis or the Y-axis so the ancilla qubit is in the second state.

7. The method according to claim 1, wherein applying the second echo pulse to the data qubit temporally following the applied second cross-resonance pulse comprises applying the second echo pulse to the data qubit so as to rotate the data qubit around X-axis or Y-axis by $+\pi$ to obtain a changed state of the data qubit from the second state to the first state or to obtain a changed state of the data qubit from the first state to the second state.

8. The method according to claim 7, wherein the changed state of the data qubit from the second state to the first state while the ancilla qubit is in the second state.

9. The method according to claim 7, wherein the changed state of the data qubit from the first state to the second state while the ancilla qubit is in the second state.

10. The method according to claim 1, wherein detecting the leakage associated with the data qubit using the ancilla qubit coupled to the data qubit comprises measuring a state of the ancilla qubit and when the ancilla qubit is the second state determining that a leakage does not exist and when the ancilla qubit is in the first state determining that a leakage exists.

11. The method according to claim 1, wherein applying the first echo pulse and applying the second echo pulse to the data qubit cause a rotation of the data qubit when the data qubit has not leaked and does not cause a rotation of the data qubit when the data qubit has leaked.

12. The method according to claim 11, wherein when the data qubit is a leaked data qubit, the leaked data qubit causes the first cross-resonance pulse to be cancelled out by the second cross-resonance pulse and the data qubit remains where it started in the first state.

13. A quantum mechanical system for detecting leakage of a data qubit, comprising:
   a data qubit and an ancilla qubit;
   a first cross-resonance gate configured to apply a first cross-resonance pulse to the data qubit to couple the data qubit to an ancilla qubit, the data qubit including a first state and a second state;
   a first pulse generator configured to apply a first echo pulse to the data qubit temporally following the applied first cross-resonance pulse;
   a second cross-resonance gate configured to apply a second cross-resonance pulse to the data qubit temporally following the applied first echo pulse to couple the data qubit with the ancilla qubit, the second cross-resonance pulse being an inverted form of the first cross-resonance pulse;
   a second pulse generator configured to apply a second echo pulse to the data qubit temporally following the second cross-resonance pulse; and
   a quantum mechanical detector configured to detect a leakage associated with the data qubit using the ancilla qubit coupled to the data qubit based on application of the first and second cross-resonance pulses, and the first and second echo pulses.

14. The quantum mechanical system according to claim 13, wherein the data qubit and the ancilla qubit are transmon qubits.

15. The quantum mechanical system according to claim 13, wherein the quantum mechanical detector is configured to detect the leakage of the data qubit without directly measuring the data qubit or projecting the data qubit into the first state or into the second state so as to leave the data qubit as the superposition of the first state and the second state.

16. The quantum mechanical system according to claim 13, wherein the first pulse generator is configured to applying the first echo pulse to the data qubit so as to rotate the data qubit around the X-axis or the Y-axis by $+\pi$ to obtain a changed state of the data qubit from the first state to the second state or to obtain a changed state of the data qubit from the second state to the first state.

17. The quantum mechanical system according to claim 13, wherein the second cross-resonance gate is configured to apply a selected amplitude of the second cross-resonance pulse to the data qubit so as to rotate the ancilla qubit around the X-axis or the Y-axis so the ancilla qubit is in the second state.

18. The quantum mechanical system according to claim 13, wherein the second pulse generator is configured to apply the second echo pulse to the data qubit so as to rotate the data qubit around X-axis or the Y-axis by $+\pi$ to obtain a changed state of the data qubit from the second state to the first state or to obtain a changed state of the data qubit from the first state to the second state.

19. The quantum mechanical system according to claim 13, wherein the quantum mechanical detector is configured to measure a state of the ancilla qubit and determine that a leakage does not exist when the ancilla qubit is in the second state and determine that leakage exists when the ancilla qubit is in the first state.

20. The quantum mechanical system according to claim 13, wherein the first pulse generator and the second pulse generator are a same and one pulse generator.

\* \* \* \* \*